(12) United States Patent
Kang

(10) Patent No.: US 12,039,936 B2
(45) Date of Patent: Jul. 16, 2024

(54) DISPLAY DRIVING APPARATUS, DISPLAY PANEL, AND DISPLAY APPARATUS

(71) Applicant: SAMSUNG DISPLAY CO., LTD., Yongin-si (KR)

(72) Inventor: Dohyun Kang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 464 days.

(21) Appl. No.: 17/183,586

(22) Filed: Feb. 24, 2021

(65) Prior Publication Data

US 2021/0407428 A1    Dec. 30, 2021

(30) Foreign Application Priority Data

Jun. 26, 2020    (KR) ........................ 10-2020-0078817

(51) Int. Cl.
*G09G 3/3266*    (2016.01)
*G09G 3/3233*    (2016.01)
*G09G 3/3275*    (2016.01)
*H10K 59/131*    (2023.01)

(52) U.S. Cl.
CPC ......... *G09G 3/3266* (2013.01); *G09G 3/3233* (2013.01); *G09G 3/3275* (2013.01); *H10K 59/131* (2023.02)

(58) Field of Classification Search
CPC .. G09G 3/2092; G09G 3/3225; G09G 3/3233; G09G 3/3266; G09G 3/3275; G09G 2300/0842; G09G 2358/00; H01L 27/124; H10K 59/131
See application file for complete search history.

(56) References Cited

U.S. PATENT DOCUMENTS

| 6,100,949 | A | * | 8/2000 | Kim | ................ | G02F 1/136204 |
|  |  |  |  |  |  | 349/40 |
| 6,738,122 | B2 |  | 5/2004 | Lim |  |  |
| 8,629,824 | B2 |  | 1/2014 | Park |  |  |
| 10,049,635 | B2 |  | 8/2018 | Kawamura et al. |  |  |
| 2015/0091783 | A1 | * | 4/2015 | Hwang | ............... | G09G 3/3611 |
|  |  |  |  |  |  | 345/55 |
| 2017/0116923 | A1 |  | 4/2017 | Bae et al. |  |  |
| 2018/0082643 | A1 | * | 3/2018 | Jeong | .................... | G09G 3/342 |

(Continued)

FOREIGN PATENT DOCUMENTS

| CN | 110297342 A | * | 10/2019 | ............ | G02F 1/133 |
| JP | H05265045 A | * | 10/1993 | ........... | G09G 3/3659 |

(Continued)

*Primary Examiner* — Stacy Khoo
(74) *Attorney, Agent, or Firm* — CANTOR COLBURN LLP

(57) ABSTRACT

A display panel includes: a substrate including a display area and a peripheral area; a plurality of pixels arranged in the display area; a pad portion arranged in the peripheral area and including a first clock pad, a plurality of first scan pads, and a plurality of data pads; a first scan driving circuit including a plurality of first stages; a plurality of scan lines including a plurality of first scan lines respectively connected to the plurality of first scan pads, and a plurality of second scan lines respectively connected to the plurality of first stages; and a plurality of data lines respectively extending in a second direction and connected to corresponding data pads among the plurality of data pads and pixels.

20 Claims, 9 Drawing Sheets

(56) References Cited

U.S. PATENT DOCUMENTS

| | | | |
|---|---|---|---|
| 2019/0325843 A1* | 10/2019 | Pyun | H03F 3/45179 |
| 2019/0357367 A1 | 11/2019 | Chung et al. | |
| 2019/0377438 A1* | 12/2019 | Kim | G06F 3/0443 |
| 2020/0142268 A1* | 5/2020 | Shin | G02F 1/13458 |

FOREIGN PATENT DOCUMENTS

| | | | | |
|---|---|---|---|---|
| JP | 2011013415 A | * | 1/2011 | G09G 3/3266 |
| KR | 100389022 B1 | | 6/2003 | |
| KR | 101351379 B1 | | 1/2014 | |
| KR | 1020160039892 A | | 4/2016 | |
| KR | 1020170047442 A | | 5/2017 | |
| KR | 1020180032260 A | | 3/2018 | |
| KR | 1020190131156 A | | 11/2019 | |
| KR | 1020200005347 A | | 1/2020 | |
| WO | WO-2019024657 A1 | * | 2/2019 | G09G 3/20 |

\* cited by examiner

DISPLAY DRIVING APPARATUS, DISPLAY PANEL, AND DISPLAY APPARATUS

This application claims priority to Korean Patent Application No. 10-2020-0078817, filed on Jun. 26, 2020, and all the benefits accruing therefrom under 35 U.S.C. § 119, the content of which in its entirety is herein incorporated by reference.

BACKGROUND

1. Field

One or more embodiments relate to a display driving apparatus, a display panel, and a display apparatus, and more particularly, to a display driving apparatus, a display panel, and a display apparatus, in which a peripheral area is reduced.

2. Description of Related Art

A display apparatus is an apparatus for displaying data visually. The display apparatus may be used as a display of a small product such as a mobile phone, and may be used as a display of a large product such as a television.

The display apparatus includes a substrate partitioned into a display area and a peripheral area, and gate lines and data lines are insulated from each other in the display area. The gate lines and the data lines intersect with each other to define a plurality of pixel areas in the display area. The pixel areas receive electrical signals to emit light so as to display images to the outside. A thin-film transistor and a pixel electrode electrically connected to the thin-film transistor are provided in each pixel area, and an opposite electrode is commonly provided in the pixel areas. Various wirings configured to transmit electrical signals to the display area, a gate driver, a data driver, a controller, and the like may be provided in the peripheral area.

The usage of the display apparatus has diversified. Also, the display apparatus becomes thinner and lighter, and thus, the uses of the display apparatus has expanded. As the number of users who use the display apparatus has increased, studies have been actively conducted to provide visual satisfaction to the users. One of them is to expand display areas of the display apparatus. In this regard, various studies have been conducted to expand display areas of the display apparatus.

SUMMARY

However, in a display driving apparatus, a display panel, and a display apparatus according to the related art, a lower corner of the display panel has a curvature, resulting in an increase in a peripheral area of the display panel.

One or more embodiments include a display driving apparatus, a display panel, and a display apparatus, in which a peripheral area is reduced. However, this is merely an example, and the scope of the disclosure according to the invention is not limited thereby.

Additional aspects will be set forth in part in the description which follows and, in part, will be apparent from the description, or may be learned by practice of the presented embodiments of the disclosure.

According to one or more embodiments, a display panel includes: a substrate including a display area and a peripheral area surrounding the display area; a plurality of pixels arranged in the display area; a pad portion arranged in the peripheral area and including a first clock pad, a plurality of first scan pads, and a plurality of data pads; a first scan driving circuit arranged in the peripheral area and including a plurality of first stages; a plurality of scan lines extending in a first direction and including a plurality of first scan lines and a plurality of second scan lines, where the plurality of first scan lines is connected to the plurality of first scan pads, respectively, the plurality of second scan lines is connected to the plurality of first stages, respectively, and each of the plurality of scan lines is connected to pixels located in a same row among the plurality of pixels; and a plurality of data lines extending in a second direction intersecting with the first direction and connected to corresponding data pads, respectively, among the plurality of data pads and pixels, wherein each of the plurality of data lines is connected to pixels located in the same column among the plurality of pixels.

According to an embodiment, the number of pixels connected to one of the plurality of first scan lines may be less than the number of pixels connected to one of the plurality of second scan lines.

According to an embodiment, a length of a portion of each of the plurality of first scan lines extended in the first direction may be less than a length of a portion of each of the plurality of second scan lines extended in the first direction.

According to an embodiment, the plurality of scan lines may be configured to sequentially transmit a current scan signal to the plurality of pixels by a pixel-row unit, and the plurality of first stages may be connected to the first clock pad and configured to receive a first clock signal from the first clock pad and sequentially output the current scan signal to the plurality of second scan lines based on the first clock signal.

According to an embodiment, each of the plurality of first stages may be connected to a previous first stage or a previous scan line and configured to receive a previous control signal from the previous first stage or a previous scan signal from the previous scan line and generate the current scan signal based on the first clock signal and one of the previous control signal and the previous scan signal.

According to an embodiment, a first-order first stage among the plurality of first stages may be connected to a last-order first scan line among the plurality of first scan lines and configured to receive a previous scan signal from the last-order first scan line and generate the current scan signal based on the first clock signal and the previous scan signal.

According to an embodiment, the pad portion may further includes a plurality of second scan pads, and each of the plurality of first scan lines may include a first end connected to a corresponding first scan pad among the plurality of first scan pads, and a second end connected to a corresponding second scan pad among the plurality of second scan pads, where the first end and the second end are disposed symmetrically with respect to a center of the pad portion.

According to an embodiment, the pad portion may further include a second clock pad, the display panel may further include a second scan driving circuit arranged in the peripheral area and including a plurality of second stages connected to the plurality of second scan lines, respectively, the plurality of first stages may be connected to the first clock pad and configured to receive a first clock signal from the first clock pad and sequentially output a first scan signal to the plurality of second scan lines based on the first clock signal, and the plurality of second stages may be connected to the second clock pad and configured to receive a second clock signal from the second clock pad and sequentially output a second scan signal to the plurality of second scan lines based on the second clock signal. The first clock signal and the second clock signal may be synchronized with each other, and the first scan signal and the second scan signal may be synchronized with each other.

According to an embodiment, the plurality of data pads may be disposed between the plurality of first scan pads and the plurality of second scan pads, and the plurality of data lines may be disposed between the first scan driving circuit and the second scan driving circuit.

According to an embodiment, the display panel may further include a plurality of connection lines connecting the plurality of first scan pads to the plurality of first scan lines, respectively, and each of the plurality of connection lines may have a portion extending in the second direction between the plurality of data lines.

According to an embodiment, the plurality of first scan pads may be disposed between the plurality of data pads.

According to an embodiment, the plurality of scan lines may further include a plurality of third scan lines located in the second direction from the plurality of first scan lines and the plurality of second scan lines and extending in the first direction, and the display area may include a first display area in which pixels connected to the plurality of first scan lines among the plurality of pixels are arranged, a second display area in which pixels connected to the plurality of second scan lines among the plurality of pixels are arranged, and a third display area in which pixels connected to the plurality of third scan lines among the plurality of pixels are arranged.

According to an embodiment, the number of pixels connected to a first scan line of the plurality of first scan lines may gradually decrease in a direction away from the second display area, the number of pixels connected to each of the plurality of second scan lines may be constant, and the number of pixels connected to a third scan line of the plurality of third scan lines may gradually decrease in a direction away from the second display area.

According to an embodiment, the first scan driving circuit may further include a plurality of third stages connected to the plurality of third scan lines, respectively, the plurality of first stages may be arranged in a line in the second direction, and the plurality of third stages may be arranged to shift in the first direction along the second direction.

According to an embodiment, the plurality of third stages may be connected to the first clock pad and configured to receive a first clock signal from the first clock pad, and each of the plurality of third stages may be connected to a previous stage and configured to receive a previous control signal from the previous stage, and generate a scan signal based on the first clock signal and the previous control signal, and the plurality of third stages may sequentially output the scan signal to the plurality of third scan lines.

According to one or more embodiments, a display apparatus includes: a plurality of pixels; a pad portion including a first clock pad, a plurality of first scan pads, and a plurality of data pads; a first scan driving circuit including a plurality of first stages; a plurality of scan lines extending in a first direction and including a plurality of first scan lines and a plurality of second scan lines, where the plurality of first scan lines is connected to the plurality of first scan pads, respectively, the plurality of second scan lines is connected to the plurality of first stages, respectively, and each of the plurality of scan lines is connected to pixels located in a same row among the plurality of pixels; a plurality of data lines extending in a second direction intersecting with the first direction and connected to corresponding data pads, respectively, among the plurality of data pads, where each of the plurality of data lines is connected to pixels located in the same column among the plurality of pixels; and a display driving circuit which drives the plurality of pixels.

According to an embodiment, the display driving circuit may further include an electrode portion including a clock electrode, a plurality of scan electrodes, and a plurality of data electrodes connected to the first clock pad, the plurality of first scan pads, and the plurality of data pads, respectively, a clock signal output circuit which outputs a clock signal to the clock electrode, a gate driving circuit which sequentially outputs a scan signal to the plurality of scan electrodes in synchronization with the clock signal, and a data driving circuit which outputs data voltages to the plurality of data electrodes in synchronization with the clock signal.

According to an embodiment, the display apparatus may further include a printed circuit board including wirings which connects the clock electrode, the plurality of scan electrodes, and the plurality of data electrodes to the first clock pad, the plurality of first scan pads, and the plurality of data pads, respectively, the display driving circuit may be mounted on the printed circuit board, and the printed circuit board may be mounted on the pad portion.

According to an embodiment, the number of pixels connected to one of the plurality of first scan lines may be less than the number of pixels connected to one of the plurality of second scan lines.

According to one or more embodiments, a display driving apparatus, which is implemented as a single semiconductor integrated circuit chip which drives a display panel having m scan lines and n data lines, where m and n are natural numbers, includes a clock electrode, a plurality of scan electrodes, a plurality of data electrodes, a clock signal output circuit which outputs, to the clock electrode, a clock signal used to generate a local scan signal for sequentially driving some of the m scan lines in the display panel, a gate driving circuit which sequentially outputs an external scan signal to the plurality of scan electrodes in synchronization with the clock signal, and a data driving circuit which outputs a plurality of data voltages to the plurality of data electrodes in synchronization with the clock signal, wherein the number of the plurality of scan electrodes is less than m.

Other aspects, features and advantages of the disclosure will become better understood through the accompanying drawings, the claims and the detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
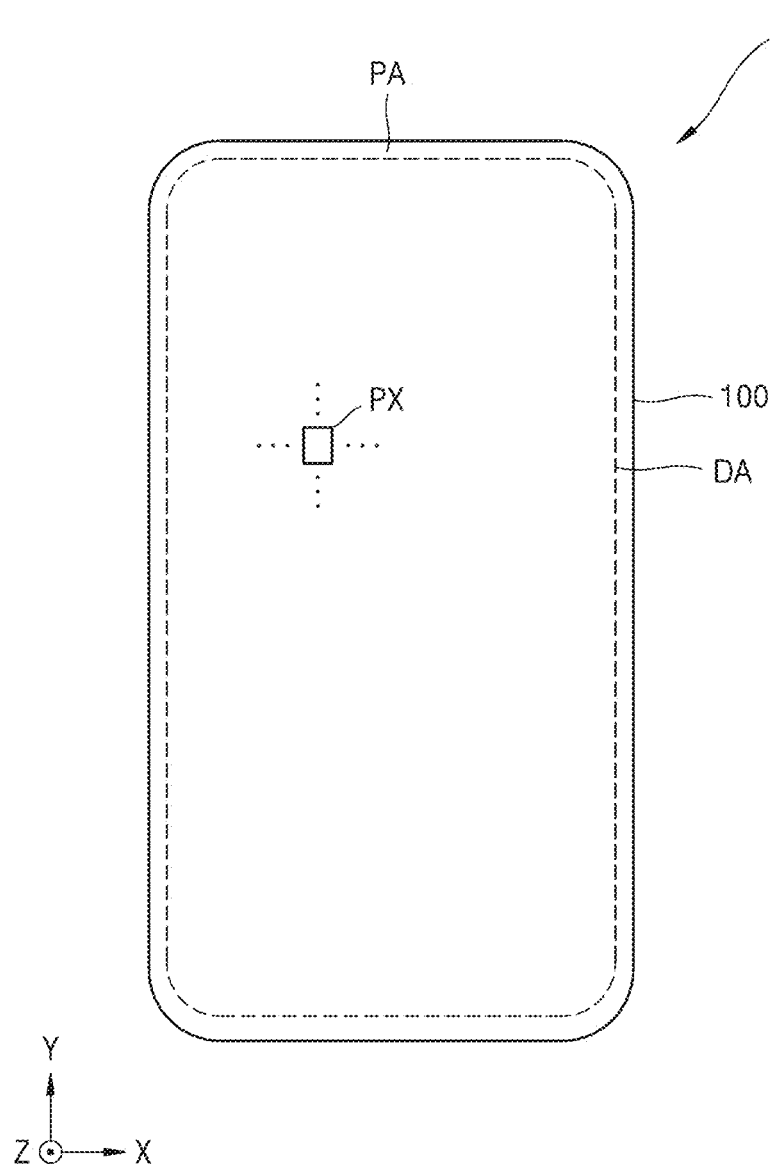
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Because the disclosure may have diverse modified embodiments, preferred embodiments are illustrated in the drawings and are described in the detailed description. An effect and a characteristic of the disclosure, and a method of accomplishing these will be apparent when referring to embodiments described with reference to the drawings. The disclosure may, however, be embodied in many different forms and should not be construed as limited to the embodiments set forth herein.

One or more embodiments of the disclosure will be described below in more detail with reference to the accompanying drawings. Those components that are the same or are in correspondence with each other are rendered the same reference numeral regardless of the figure number, and redundant explanations are omitted.

It will be understood that although the terms "first," "second," etc. may be used herein to describe various elements, these elements should not be limited by these terms. These terms are only used to distinguish one element from another.

An expression used in the singular encompasses the expression of the plural, unless it has a clearly different meaning in the context.

It will be further understood that the terms "comprises" and/or "comprising" used herein specify the presence of stated features or elements, but do not preclude the presence or addition of one or more other features or elements.

It will be understood that when a layer, region, or element is referred to as being "formed on" another layer, area, or element, it may be directly or indirectly formed on the other layer, region, or element. That is, for example, intervening layers, regions, or elements may be present.

Sizes of elements in the drawings may be exaggerated for convenience of explanation. In other words, because sizes and thicknesses of components in the drawings are arbitrarily illustrated for convenience of explanation, the following embodiments according to the invention are not limited thereto.

When a certain embodiment may be implemented differently, a specific process order may be performed differently from the described order. For example, two consecutively described processes may be performed substantially at the same time or performed in an order opposite to the described order.

In this specification, the expression "A and/or B" indicates only A, only B, or both A and B. Throughout the disclosure, the expression "at least one of A and B" indicates only A, only B, or both A and B.

In the following embodiments, it will be understood that when a layer, region, or element is referred to as being "connected to" or "coupled to" another layer, region, and element, it may be directly or indirectly connected or coupled to the other layer, region, or element. That is, for example, intervening layers, regions, or elements may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. That is, for example, intervening layers, regions, or elements may be present.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a schematic plan view of a display apparatus 1 according to an embodiment.

Referring to FIG. 1, the display apparatus 1 may include a display area DA on which an image is displayed, and a peripheral area PA arranged around the display area DA. The display apparatus 1 may provide an image to the outside by using light emitted from the display area DA.

The display apparatus 1 includes a substrate 100. The substrate 100 may include glass or a polymer resin. The polymer resin may include polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layer structure including a layer including the above-described polymer resin and an inorganic layer (not illustrated).

Pixels PX, each including a display element such as an organic light-emitting diode ("OLED"), may be arranged in the display area DA of the substrate 100. A plurality of pixels PX may be provided. The pixels PX may be arranged in various forms, for example, a stripe form, a pentile form, or a mosaic form, and may emit light to represent an image.

In a plan view, the display area DA may be provided in a substantially rectangular shape as illustrated in FIG. 1, and corners (see C in FIG. 3) of the display area DA may have a curvature. In another embodiment, the display area DA may be provided in a polygonal shape (e.g., a triangular shape, a pentagonal shape, a hexagonal shape, etc.), a circular shape, an elliptical shape, or an irregular shape.

The peripheral area PA of the substrate 100 is an area arranged around the display area DA and may be an area on which an image is not displayed. A driving circuit configured to drive the pixels PX of the display area DA, various wirings configured to transmit electrical signals to be applied to the display area DA, pads to which a printed circuit board or a driver integrated circuit ("IC") chip is attached, and the like may be located in the peripheral area PA.

Figure 2:
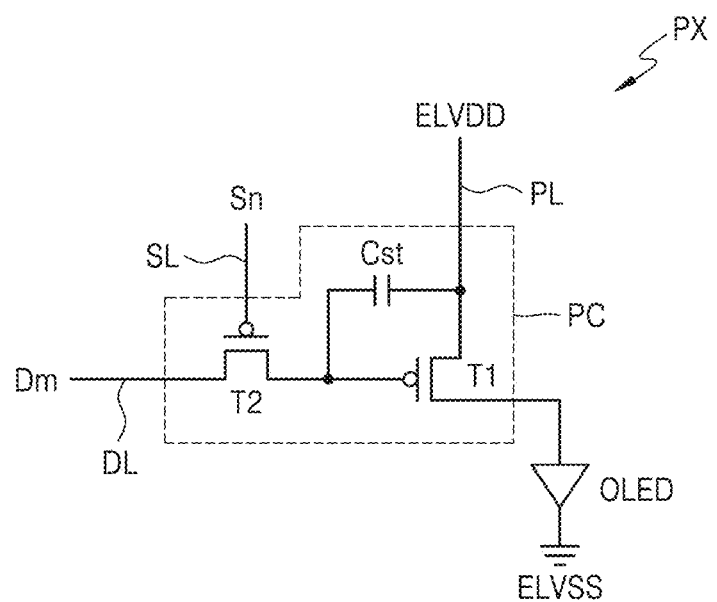
FIG. 2 is an equivalent circuit diagram of a pixel in a display apparatus, according to an embodiment.

FIG. 2 is an equivalent circuit diagram of a pixel PX in a display apparatus, according to an embodiment.

Referring to FIG. 2, the pixel PX includes a pixel circuit PC connected to a scan line SL and a data line DL, and an organic light-emitting diode OLED connected to the pixel circuit PC.

The pixel circuit PC includes a driving thin-film transistor ("TFT") T1, a switching TFT T2, and a storage capacitor Cst. The switching TFT T2 is connected to the scan line SL and the data line DL and is configured to transfer, to the driving TFT T1, a data signal Dm input via the data line DL in response to a scan signal Sn input via the scan line SL.

The storage capacitor Cst is connected to the switching TFT T2 and a driving voltage line PL and is configured to store a voltage corresponding to a difference between a voltage received from the switching TFT T2 and a driving voltage ELVDD supplied to the driving voltage line PL.

The driving TFT T1 may be connected to the driving voltage line PL and the storage capacitor Cst and may be configured to control a driving current flowing from the driving voltage line PL to the organic light-emitting diode OLED according to a voltage value stored in the storage capacitor Cst. The organic light-emitting diode OLED may emit light according to the driving current, and the luminance of the light may be determined by the driving current.

A case in which the pixel circuit PC includes two TFTs and one storage capacitor has been described with reference to FIG. 2, but the disclosure according to the invention is not limited thereto. In another embodiment, for example, the pixel circuit PC may include three or more TFTs and/or two or more storage capacitors. In still another embodiment, the pixel circuit PC may include seven TFTs and one storage capacitor.

Figure 3:
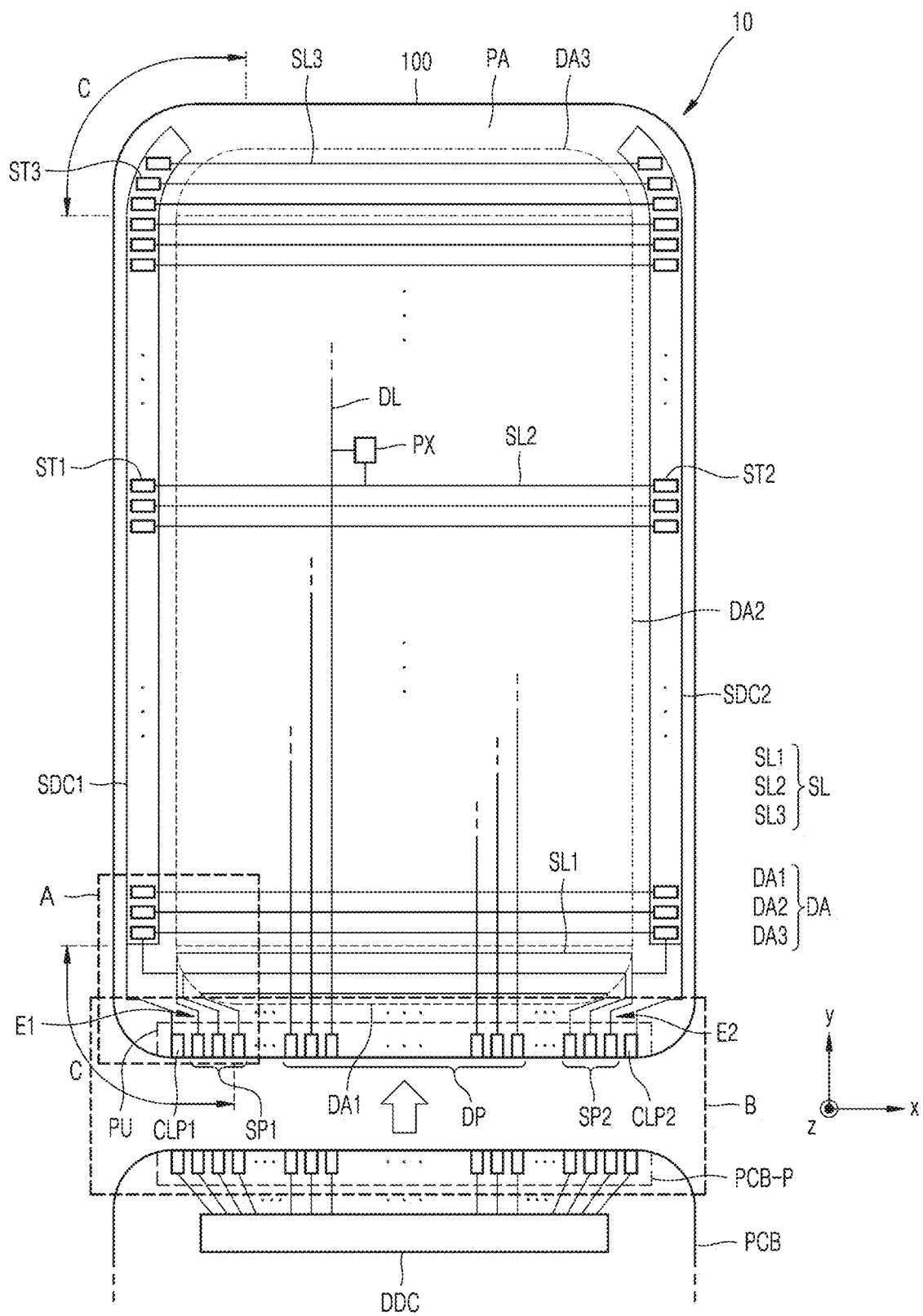
FIG. 3 is a schematic plan view of a display panel according to an embodiment.
Figure 4:
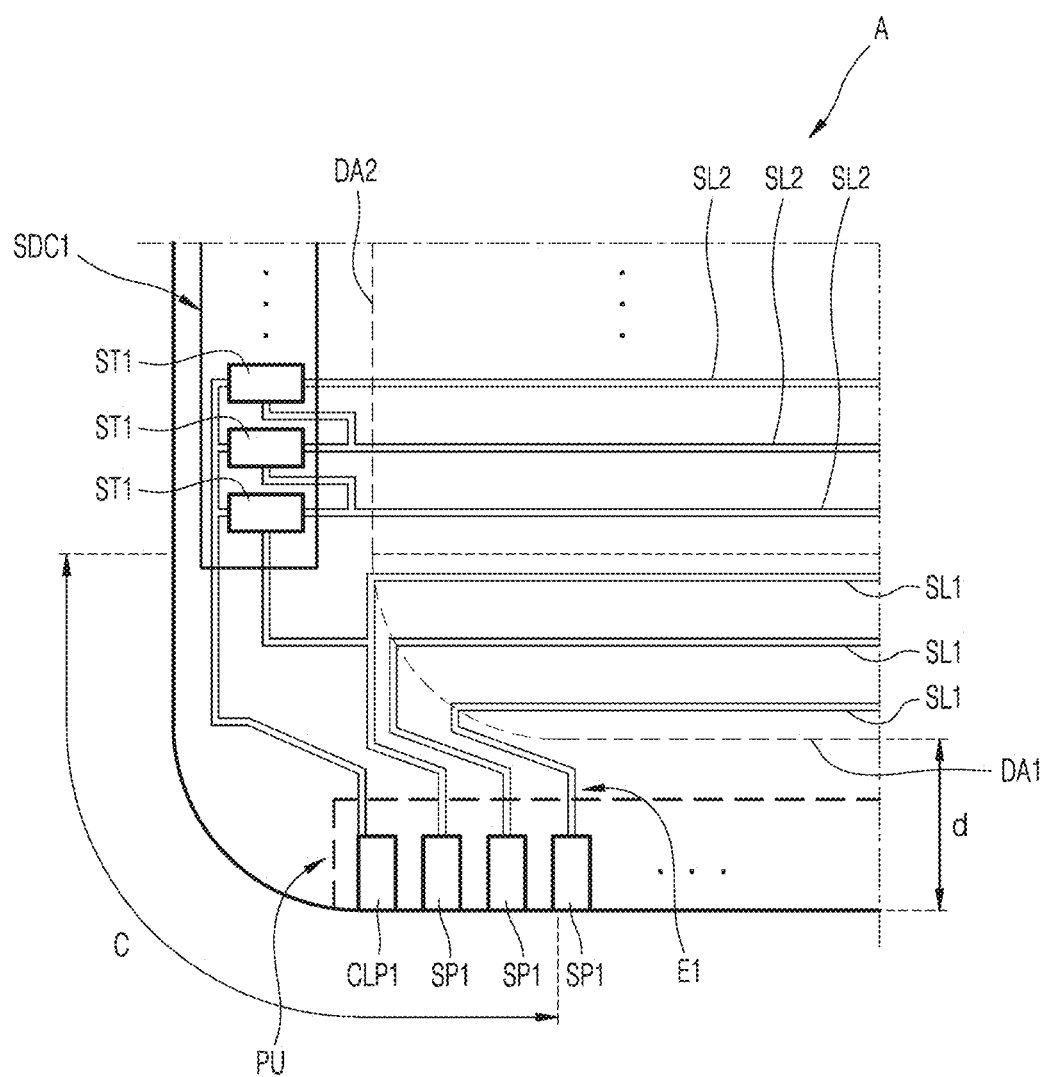
FIG. 4 is a schematic enlarged plan view of a portion A of FIG. 3.

FIG. 3 is a schematic plan view of a display panel 10 according to an embodiment, and FIG. 4 is a schematic enlarged plan view of a portion A of FIG. 3.

Referring to FIG. 3, the display panel 10 includes a display area DA and a peripheral area PA and includes a plurality of pixels PX arranged in the display area DA. Also, the display panel 10 includes a plurality of scan lines SL extending in a first direction (e.g., +x direction) and a plurality of data lines DL extending in a second direction (e.g., +y direction). The second direction intersects with the first direction. Each of the plurality of scan lines SL is connected to the pixels PX located in the same row, and each of the plurality of data lines DL is connected to the pixels PX located in the same column.

The scan lines SL may be divided into a plurality of first scan lines SL1, a plurality of second scan lines SL2, and a plurality of third scan lines SL3 according to elements connected thereto. Also, the display area DA may be divided into a first display area DA1 in which the pixels PX connected to the first scan lines SL1 are arranged, a second display area DA2 in which the pixels PX connected to the second scan lines SL2 are arranged, and a third display area DA3 in which the pixels PX connected to the third scan lines SL3 are arranged. In this case, the number of pixels PX of one row arranged in each of the first, second, and third display areas DA1, DA2, and DA3 may be different according to the shape of the display area DA.

The pixels PX may each include a display element such as an organic light-emitting diode. The pixels PX may each emit, for example, red light, green light, blue light, or white light from the organic light-emitting diode. Hereinafter, in this specification, the pixels PX refer to sub-pixels that emit different colors of light, and the pixels PX may each be, for example, one of a red (R) sub-pixel, a green (G) sub-pixel, and a blue (B) sub-pixel. The display area DA may be covered with an encapsulation member (not illustrated) so as to be protected from external air or moisture.

The pixels PX may each be electrically connected to driving circuits arranged in the peripheral area PA. A first scan driving circuit SDC1, a second scan driving circuit SDC2, and a pad portion PU may be arranged in the peripheral area PA. The first scan driving circuit SDC1 and the second scan driving circuit SDC2 may be disposed in both long sides and corners C in the peripheral area PA, respectively. For example, as shown in FIG. 3, the first scan driving circuit SDC1 may be disposed the left long side and upper corner C thereof in the peripheral area PA, and the second scan driving circuit SDC2 may be disposed in the right long sides and the upper corner C thereof in the peripheral area PA. In addition, although not illustrated, an emission control driving circuit, a first power supply line, and a second power supply line may be arranged in the peripheral area PA.

The first scan driving circuit SDC1 includes a plurality of first stages ST1. The first stages ST1 are connected to the second scan lines SL2, respectively. The second scan lines SL2 partially overlap the second display area DA2 in a plan view. Each of the scan lines SL is configured to transmit the scan signal to the pixels PX located in the same row. Similarly, the first stages ST1 are configured to sequentially output scan signals to the second scan lines SL2, and each of the second scan lines SL2 is configured to transmit the scan signal to the pixels PX located in the same row. In other words, the plurality of second scan lines SL2 is configured to sequentially transmit a scan signal to the plurality of pixels PX by a pixel-row unit. As used herein, "a signal is transmitted to a plurality of pixels by a pixel-row unit" means "a signal is transmitted to the plurality of pixels, and the pixels in the same row receives the signal at the same time."

The second scan driving circuit SDC2 may be arranged in parallel with the first scan driving circuit SDC1 with the display area DA therebetween. The second scan driving circuit SDC2 includes a plurality of second stages ST2. The second stages ST2 are connected to the second scan lines SL2, respectively. The second scan lines SL2 partially overlap the second display area DA2 among the scan lines SL in the plan view. Like the first stages ST1, the second stages ST2 are configured to sequentially output scan signals to the second scan lines SL2, and each of the second scan lines SL2 is configured to transmit the scan signal to the pixels PX located in the same row. Although FIG. 3 illustrates that the first stages ST1 and the second stages ST2 connect the same second scan lines SL2, respectively, in another embodiment, each of the second scan lines SL2 may be connected to one of the first stage ST1 or the second stage ST2. For example, the first stages ST1 may be connected to the odd second scan line SL2 among the second scan lines SL2, and the second stages ST2 may be connected to the even second scan line SL2 among the second scan lines SL2. In another embodiment, the second scan driving circuit SDC2 may be omitted.

The first scan driving circuit SDC1 may further include a plurality of third stages ST3. The third stages ST3 are connected to the third scan lines SL3, respectively. The third scan lines SL3 partially overlap the third display area DA3 in the plan view. As described above, the third stages ST3 are configured to sequentially output scan signals to the third scan lines SL3, and each of the third scan lines SL3 is configured to transmit the scan signal to the pixels PX located in the same row in the third display area DA3. Although the description has focused on the first scan driving circuit SDC1, the same may apply to the second scan driving circuit SDC2.

In an embodiment, the first stages ST1 may be arranged in a line in the second direction (e.g., +y direction) and disposed adjacent to the second display area DA2, and the third stages ST3 may be arranged in the second direction and gradually shifted in the first direction (e.g., +x direction). That is, as illustrated in FIG. 3, the corners C of the display area DA and peripheral area PA may have a curvature, and the third stages ST3 may be arranged along the curvature in the peripheral area PA.

In an embodiment, the number of pixels PX of one row arranged in the second display area DA2 may be different from the number of pixels PX of one row arranged in the third display area DA3. For example, as illustrated in FIG. 3, the number of pixels PX of one row arranged in the second display area DA2 may be constant, and the number of pixels PX of one row arranged in the third display area DA3 may gradually decrease in the second direction (e.g., +y direction). That is, the number of pixels PX of one row connected to each of the second scan lines SL2 may be constant, and the number of pixels PX of one row connected to each of the third scan lines SL3 may gradually decrease in a direction away from the second display area DA2.

The pad portion PU may be arranged at one side of the substrate 100. The pad portion PU may be exposed without being covered with an insulating layer and thus electrically connected to a printed circuit board PCB. That is, a terminal PCB-P of the printed circuit board PCB may be electrically connected to the pad portion PU of the display panel 10. The pad portion PU includes a first clock pad CLP1, a second clock pad CLP2, a plurality of first scan pads SP1, a plurality of second scan pads SP2, and a plurality of data pads DP.

Referring to FIG. 4, the first clock pad CLP1 is connected to a plurality of first stages ST1 and configured to transmit a first clock signal to the first stages ST1. The first stages ST1 are configured to sequentially output a first scan signal to a plurality of second scan lines SL2 based on the first clock signal received from the first clock pad CLP1. Specifically, for example, each of the first stages ST1 is connected to a previous scan line SL2 (e.g., a scan line SL2 lower than the scan line SL2 in the same low) and configured to receive a previous scan signal from the previous scan line SL2 as shown in FIG. 4. According to another example, each of the first stages ST1 is connected to a previous first stage ST1 (e.g., a first stage ST1 right below the current first stage ST1) and configured to receive a previous control signal from the previous first stage ST1. According to another example, a first-order first stage ST1 (e.g., the lowest first stage ST1) among the first stages ST1 may be connected to a previous scan line SL1 and configured to receive a previous scan signal from the previous scan line, and the remaining first stages ST1 may be connected to a previous first stage ST1 and configured to receive a previous control signal from the previous first stage ST1. Each of the first stages ST1 is configured to generate the first scan signal based on the previous control signal or the previous scan signal, and the first clock signal. Although FIG. 4 illustrates that each of the first stages ST1 is connected to the previous scan line, each of the first stages ST1 may be connected to the previous stage in another embodiment.

Also, the third stages ST3 included in the first scan driving circuit SDC1 are also connected to the first clock pad CLP1 and configured to receive the first clock signal from the first clock pad CLP1. Like the first stages ST1, each of the third stages ST3 included in the first scan driving circuit SDC1 is also connected to the previous stage (e.g., a stage right below the current third stage ST3) or the previous scan line (e.g., a scan line right below the current scan line SL3 in the same row) and configured to receive the previous control signal from the previous stage or receive the previous scan signal from the previous stage. Each of the third stages ST3 is configured to generate the third scan signal based on the previous control signal or the previous scan signal, and the first clock signal.

In an embodiment, a first-order third stage ST3 (e.g., the lowest third stage ST3) among the third stages ST3 may be connected to a last-order second scan line SL2 (e.g., the highest second scan line SL2) among the second scan lines SL2. The first-order third stage ST3 is configured to receive the previous scan signal from the last-order second scan line SL2 and generate the third scan signal based on the first clock signal and the previous scan signal. As another example, the first-order third stage ST3 among the third stages ST3 may be connected to the last-order first stage ST1 which is the closest to the first-order third stage ST3 among the first stages ST1.

Although the description has focused on the first clock pad CLP1, the same may apply to the second clock pad CLP2. The second clock pad CLP2 may be apart from the first clock pad CLP1 with the first scan pads SP1, the data pads DP, and the second scan pads SP2 therebetween. The second clock pad CLP2 may be connected to the second stages ST2 and configured to output the second clock signal to the second stages ST2. The second stages ST2 are configured to sequentially output the second scan signal to the second scan lines SL2 based on the second clock signal received from the second clock pad CLP2. In this case, the first clock signal and the second clock signal may be synchronized with each other, and the first scan signal and the second scan signal may be synchronized with each other.

Referring back to FIG. 3, the first scan pads SP1 are arranged in the first direction and are connected to the first scan lines SL1, respectively. Each of the first scan lines SL1 is connected to the pixels PX located in the same row. The first scan lines SL1 partially overlap the first display area DA1 in the plan view. Like the first scan pads SP1, the second scan pads SP2 are also connected to the first scan lines SL1 partially overlapping the first display area DA1 in the plan view.

In an embodiment, each of the first scan lines SL1 may include a first end E1 connected to the corresponding first scan pad SP1 among the first scan pads SP1, and a second end E2 connected to the corresponding second scan pad SP2 among the second scan pads SP2. That is, one end (i.e., E1) and the other end (i.e., E2) of each of the first scan lines SL1 may be connected to one of the first scan pads SP1 and one of the second scan pads SP2, respectively. The first scan pad SP1 and the second scan pad SP2 connected to the same first scan lines SL1 are disposed symmetrically with respect to the center of the pad portion PU.

FIG. 3 illustrates that each of the first scan lines SL1 is connected to the first scan pad SP1 and the second scan pad SP2, of which a distance from the data pad DP is the same among the first scan pads SP1 and the second scan pads SP2. However, this is only an example. In another example, each of the first scan lines SL1 may be connected to the first scan pad SP1 and the second scan pad SP2, of which a distance from the data pads DP is different among the first scan pads SP1 and the second scan pads SP2.

Also, although FIG. 3 illustrates that the first scan pads SP1 and the second scan pads SP2 connect the same first scan lines SL1, respectively, the first scan lines SL1 may be connected to the first scan pads SP1 or the second scan pads SP2, respectively. In another embodiment, the second scan pads SP2 may be omitted.

In an embodiment, the number of pixels PX of one row arranged in the first display area DA1 may be different from the number of pixels PX of one row arranged in the second display area DA2. For example, as illustrated in FIG. 3, the number of pixels PX of one row arranged in the first display area DA1 may gradually increase in the second direction (e.g., +y direction), and the number of pixels PX of one row arranged in the second display area DA2 may be constant. That is, the number of pixels PX of one row connected to the first scan lines SL1 may gradually decreases in a direction away from the second display area DA2, and the number of pixels PX of one row connected to the second scan lines SL2 may be constant.

Also, the number of pixels PX connected to one of the first scan lines SL1 may be less than the number of pixels PX connected to one of the second scan lines SL2. That is, as illustrated in FIG. 3, the corners C of the display area DA may have a curvature, and the number of pixels PX of one row connected to each of the first scan lines SL1 may be different according to the curvature.

In an embodiment, the length of a portion extending of each of the first scan lines SL1 in the first direction (e.g., +x direction) may be less than the length of a portion extending of each of the second scan lines SL2 in the first direction. Specifically, a portion extending of each of the first scan lines SL1 in the first direction may correspond to a portion of each of the first scan lines SL1 overlapping the first display area DA1 in the plan view, and the length of a portion of each of the first scan lines SL1 may mean an average length. Although the description has focused on the first scan lines SL1, the same may apply to the second scan lines SL2. Therefore, the average length of a portion of each of the first scan lines SL1 overlapping the first display area DA1 may be less than an average of a portion of each of the second scan lines SL2 overlapping the second display area DA2 in the plan view.

As a comparative example, the scan lines arranged on the display panel may be connected to the stages, respectively. When the corners of the display panel or the display area have a curvature, some stages are arranged along the curvature of the corners of the display panel or the display area. Because various pads are arranged at the lower end of the display panel, a space for arranging the pads is required. Also, wirings configured to transmit data voltages from the pads to the pixels arranged in the display area have to be arranged at the corners having the curvature. However, when the scan lines are all connected to the stages and some stages are arranged along the curvature of the lower corner, not only some stages but also wirings configured to transmit data voltage have to be arranged at the corner. Thus, a non-display area becomes thick. That is, the non-display area increases as much as the space in which some stages are arranged.

However, the first scan lines SL1 among the scan lines SL arranged on the display panel 10 according to the embodiment may be connected to the first scan pads SP1, respectively, and the second scan lines SL2 may be connected to the first stages ST1, respectively. In this case, even when the lower corner C of the display panel 10 or the display area DA has a curvature, some of the first stages ST1 do not need to be arranged along the curvature of the lower corner C of the display panel 10 or the display area DA. Therefore, only a space d for arranging various pads is required at the lower end of the display panel 10, and a space for arranging some of the first stages ST1 is not required. Therefore, the peripheral area PA decreases as much as the space in which some of the first stages ST1 are arranged. Although the description has focused on the first stages ST1, the same may apply to the second stages ST2.

Referring back to FIG. 4, the first-order first stage ST1 among the first stages ST1 is connected to the last-order first scan line SL1 among the first scan lines SL1. The first-order first stage ST1 is configured to receive the previous scan signal from the last-order first scan line SL1 and generate the first scan signal based on the first clock signal received from the first clock pad CLP1 and the previous scan signal.

The data pads DP are between the first scan pads SP1 and the second scan pads SP2. The data lines DL extend in the second direction (e.g., +y direction) intersecting with the first direction (e.g., +x direction) and are between the first scan driving circuit SDC1 and the second scan driving circuit SDC2. Also, the data lines DL are connected to the pixels PX located in the same column and are connected to the corresponding data pads DP. FIG. 3 illustrates that the data pads DP are in one-to-one correspondence with the data lines DL, but the data lines DL may not be in one-to-one correspondence with the data pads DP. For example, some data lines DL may be connected to the same data pads DP among the data pads DP through a multiplexer.

The display apparatus (see 1 in FIG. 1) may include a printed circuit board PCB on which a display driving circuit DDC is mounted.

The printed circuit board PCB may be mounted on the pad portion PU, and a terminal PCB-P of the printed circuit board PCB may be electrically connected to the pad portion PU of the display panel 10. The printed circuit board PCB includes wirings connected to the first clock pad CLP1, the first scan pads SP1, the second scan pads SP2, and the data pads DP and is configured to transmit power or a signal of the controller to the display panel 10. The display driving circuit DDC mounted on the printed circuit board PCB will be described in detail below with reference to FIGS. 5 and 6.

Figure 5:
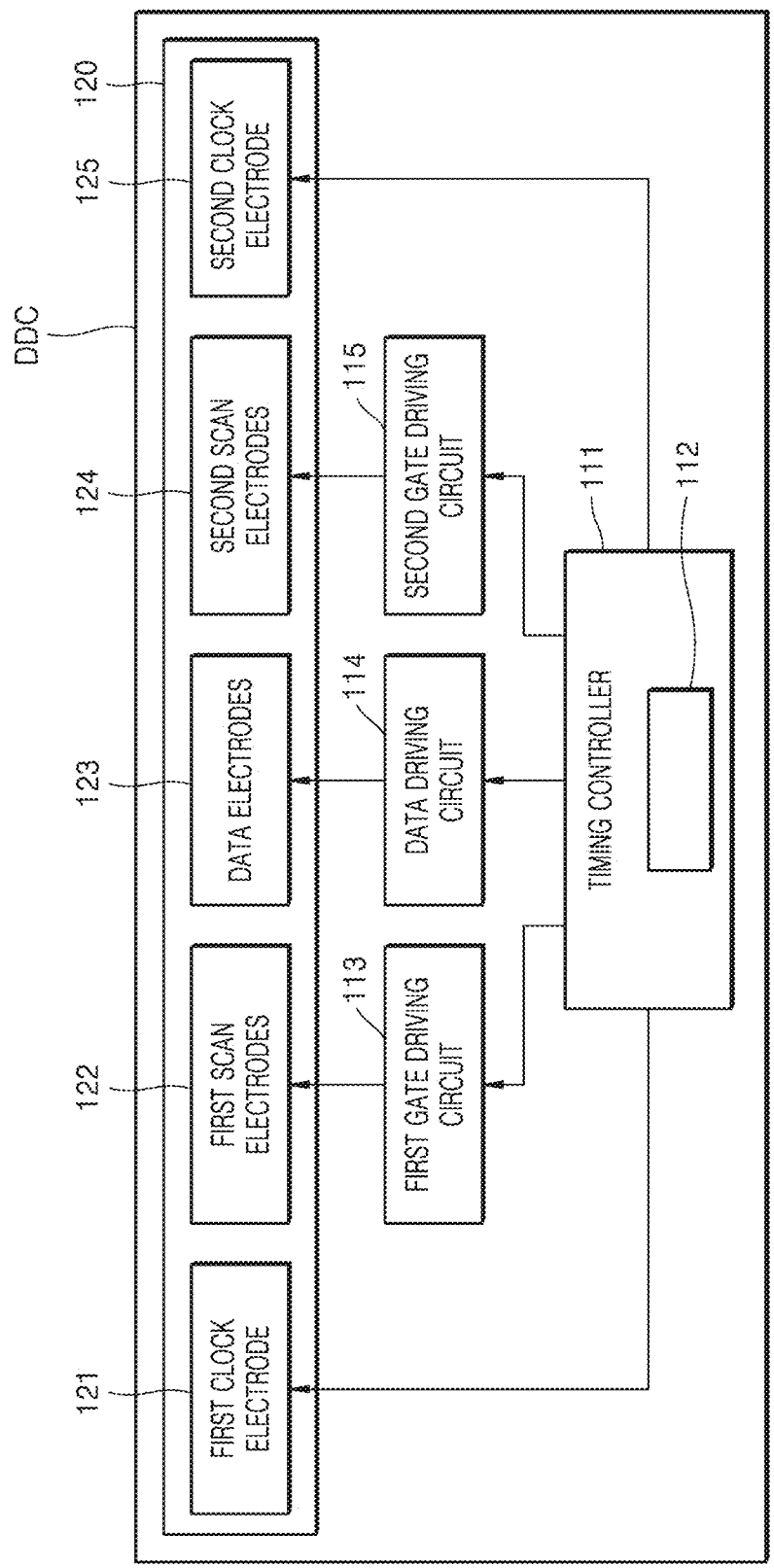
FIG. 5 is a schematic block diagram of a display driving circuit according to an embodiment.
Figure 6:
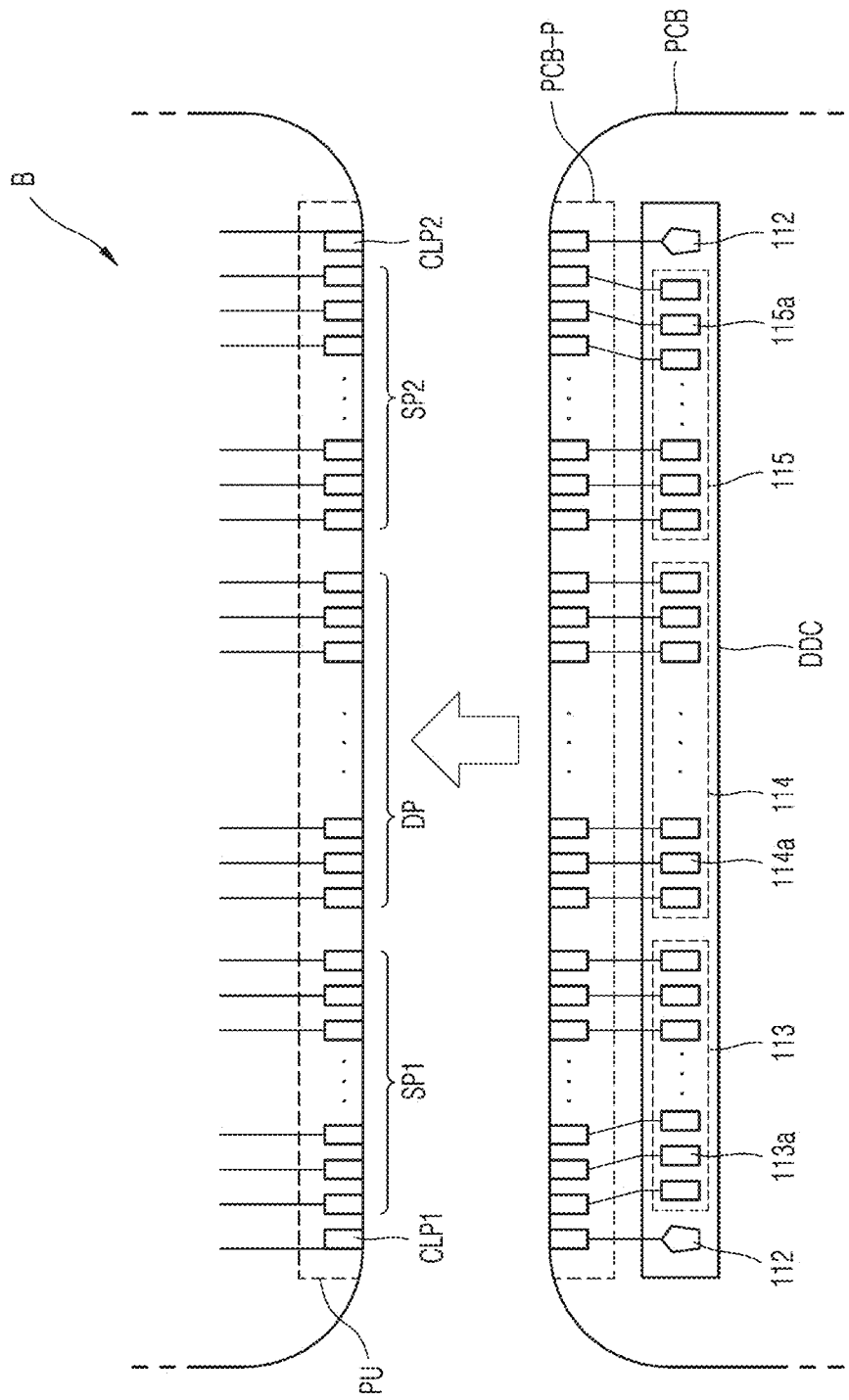
FIG. 6 is a schematic enlarged plan view of a portion B of FIG. 3.

FIG. 5 is a schematic block diagram of the display driving circuit DDC according to an embodiment, and FIG. 6 is a schematic enlarged plan view of a portion B of FIG. 3.

Referring to FIG. 5, the display driving circuit DDC includes a timing controller ("TCON") 111, a clock signal output circuit 112, a first gate driving circuit 113, a data driving circuit 114, a second gate driving circuit 115, and an electrode portion 120. The electrode portion 120 includes a first clock electrode 121, a second clock electrode 125, a plurality of first scan electrodes 122, a plurality of second scan electrodes 124, and a plurality of data electrodes 123 connected to the first clock pad CLP1 respectively, the second clock pad CLP2, the first scan pads SP1, the second scan pads SP2, and the data pads DP described above with reference to FIG. 3.

The timing controller 111 may generate various control signals that control the driving timing of the display panel 10. The timing controller 111 may control a scan signal output of the first gate driving circuit 113 and a scan signal output of the second gate driving circuit 115. Also, the timing controller 111 may transmit image data to the data driving circuit 114. The data driving circuit 114 may receive image data from the timing controller 111, generate a data voltage corresponding to the image data, and transmit the data voltage to the display panel 10.

The timing controller 111 may include the clock signal output circuit 112 that outputs a first clock signal to the first clock electrode 121 and outputs a second clock signal to the second clock electrode 125. Although FIG. 5 illustrates that the timing controller 111 includes the clock signal output circuit 112, the clock signal output circuit 112 may be separately implemented to output the first and second clock signals to the first and second clock electrodes 121 and 125, respectively, under the control of the timing controller 111.

The first gate driving circuit 113 is configured to sequentially output a scan signal to the first scan electrodes 122 in synchronization with a clock signal. Like the first gate driving circuit 113, the second gate driving circuit 115 is configured to sequentially output a scan signal to the second scan electrodes 124 in synchronization with the clock signal.

The data driving circuit 114 is configured to output data voltages to the data electrodes 123 in synchronization with the clock signal.

Referring to FIG. 6, the display driving circuit DDC is mounted on the printed circuit board PCB, and the printed circuit board PCB is mounted on the pad portion PU of the display panel 10. The terminal PCB-P of the printed circuit board PCB may be electrically connected to the pad portion PU of the display panel 10.

The printed circuit board PCB includes wirings configured to connect the first clock electrode 121, the second clock electrode 125, the first scan electrodes 122, the second scan electrodes 124, and the data electrodes 123 to the first clock pad CLP1, the second clock pad CLP2, the first scan pads SP1, the second scan pads SP2, and the data pads DP.

The first gate driving circuit 113 included in the display driving circuit DDC includes a plurality of first scan signal output circuits 113a. The first scan signal output circuits 113a are configured to sequentially output first scan signals to the first scan electrodes 122. Like the first gate driving circuit 113, the second gate driving circuit 115 includes a plurality of second scan signal output circuits 115a. The second scan signal output circuits 115a are configured to sequentially output second scan signals to the second scan electrodes 124.

The data driving circuit 114 included in the display driving circuit DDC includes a plurality of data voltage output circuits 114a. The data voltage output circuits 114a are configured to output data voltages to the data electrodes 123.

The display driving circuit DDC may be implemented as a single semiconductor integrated circuit chip. In this case, the display driving circuit DDC may be referred to as a display driving apparatus.

The display driving apparatus may be implemented as a single semiconductor integrated circuit chip that drives the display panel 10 having m scan lines SL and n data lines DL and may include a first clock electrode 121, a second clock electrode 125, a plurality of first scan electrodes 122, a plurality of second scan electrodes 124, a plurality of data electrodes 123, a clock signal output circuit 112, a first gate driving circuit 113, a second gate driving circuit 115, and a data driving circuit 114.

The clock signal output circuit 112 outputs, to the first and second clock electrodes 121 and 125, a clock signal used to generate a local scan signal for sequentially driving some of the m scan lines SL in the display panel 10.

In an embodiment, the number of first scan electrodes 122 and the number of second scan electrodes 124 may be less than m. m is an integer.

Figure 7:
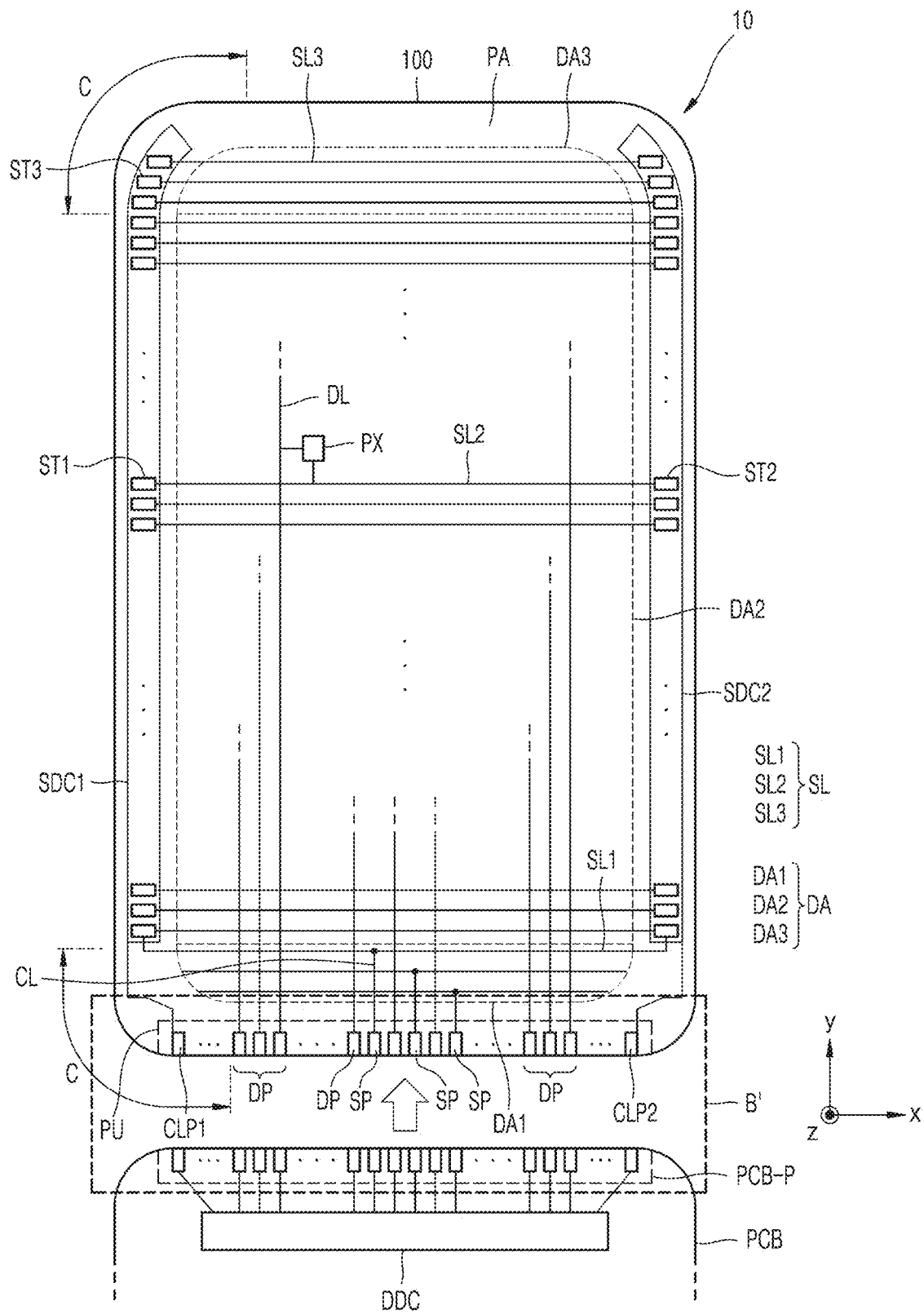
FIG. 7 is a schematic plan view of a display panel according to an embodiment.

FIG. 7 is a schematic plan view of a display panel 10 according to an embodiment. In FIG. 7, the same reference numerals as those in FIG. 3 refer to the same members, and a redundant description thereof will be omitted.

Referring to FIG. 7, the display panel 10 includes a display area DA and a peripheral area PA and includes a plurality of pixels PX arranged in the display area DA. Also, the display panel 10 includes a plurality of scan lines SL extending in a first direction (e.g., +x direction) and a plurality of data lines DL extending in a second direction (e.g., +y direction). The second direction intersects with the first direction. Each of the plurality of scan lines SL is connected to the pixels PX located in the same row, and each of the plurality of data lines DL is connected to the pixels PX located in the same column.

The scan lines SL may be divided into a plurality of first scan lines SL1, a plurality of second scan lines SL2, and a plurality of third scan lines SL3 according to elements connected thereto. Also, the display area DA may be divided into a first display area DA1 in which the pixels PX connected to the first scan lines SL1 are arranged, a second display area DA2 in which the pixels PX connected to the second scan lines SL2 are arranged, and a third display area DA3 in which the pixels PX connected to the third scan lines SL3 are arranged. In this case, the number of pixels PX arranged in the same row in each of the first, second, and third display areas DA1, DA2, and DA3 may be different according to the shape of the display area DA.

In FIG. 7, unlike those described with reference to FIGS. 3 and 4, a plurality of scan pads SP may include a plurality of connection lines CL that is arranged in the first direction (e.g., +x direction) and are connected to a plurality of first scan lines SL1. Each of the plurality of first scan lines SL1 is connected to the pixels PX located in the same row. Each of the connection lines CL may have a portion extending in the second direction between the data lines DL.

Because the substrate 100 is covered with an insulating layer, the connection lines CL are connected to the first scan lines SL1, respectively, via contact holes defined in the insulating layer.

The scan pads SP may be between the data pads DP. Although FIG. 7 illustrates that the scan pads SP and the data pads DP are alternately arranged with each other, two or more data pads DP may be between the scan pads SP. As another example, as illustrated in FIG. 3, the scan pads SP may be arranged on the left or right side of the pad portion PU and may be connected to the first scan lines SL1, respectively, via the connection lines CL.

The first scan lines SL1 among the scan lines SL arranged on the display panel 10 according to the embodiment may be connected to the first scan pads SP1, respectively, and the second scan lines SL2 may be connected to the first stages ST1, respectively. In this case, even when the lower corner C of the display panel 10 or the display area DA has a curvature, some of the first stages ST1 do not need to be arranged along the curvature of the lower corner C of the display panel 10 or the display area DA. Therefore, only a space (see d in FIG. 4) for arranging various pads is required at the lower end of the display panel 10, and a space for arranging some of the first stages ST1 is not required. Therefore, the peripheral area PA decreases as much as the space in which some of the first stages ST1 are arranged.

Also, when the scan pads SP include a plurality of connection lines CL so as to be connected to the first scan lines SL1, respectively, the number of scan pads SP may be reduced, as compared to the embodiment illustrated in FIG. 3. Therefore, because the time when the scan signal is transmitted to the first scan lines SL1 may be shortened, the pixel circuit (see PC in FIG. 2) may be driven at a high speed.

Figure 8:
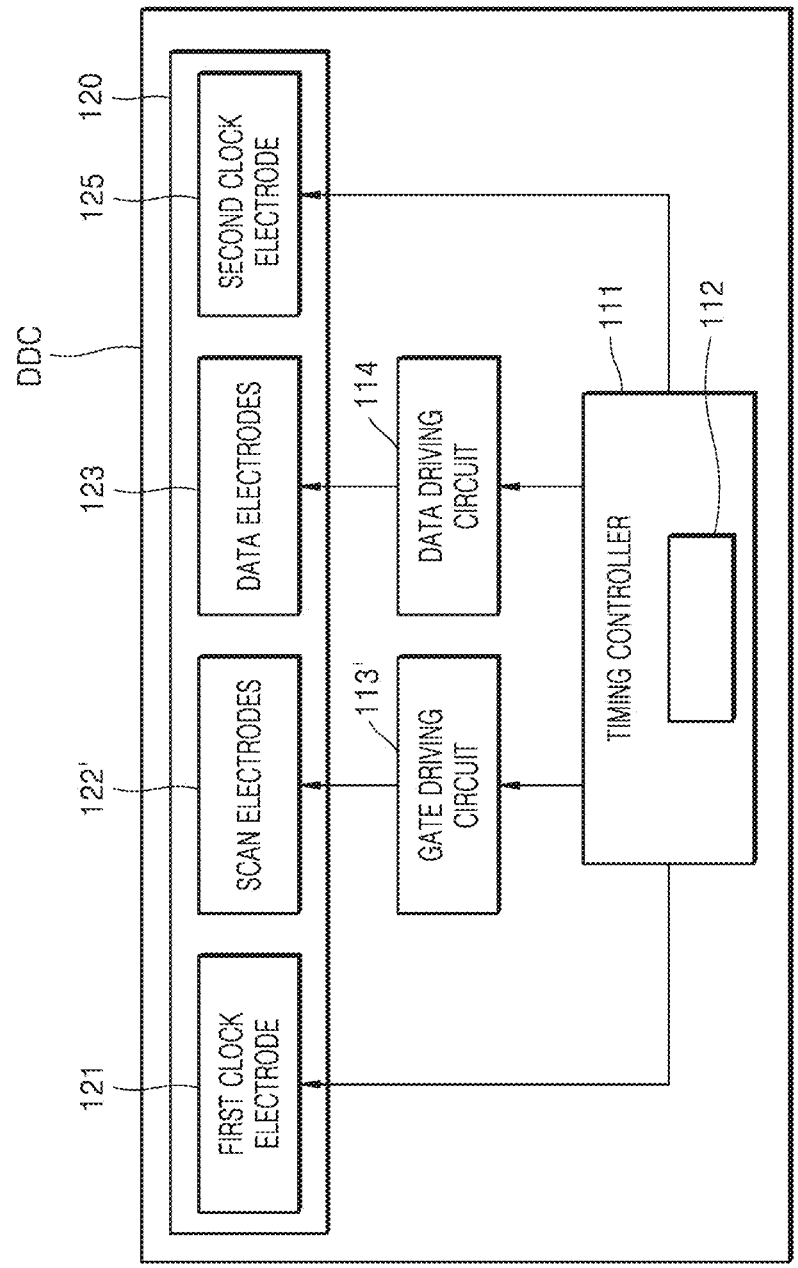
FIG. 8 is a schematic block diagram of a display driving circuit according to an embodiment.
Figure 9:
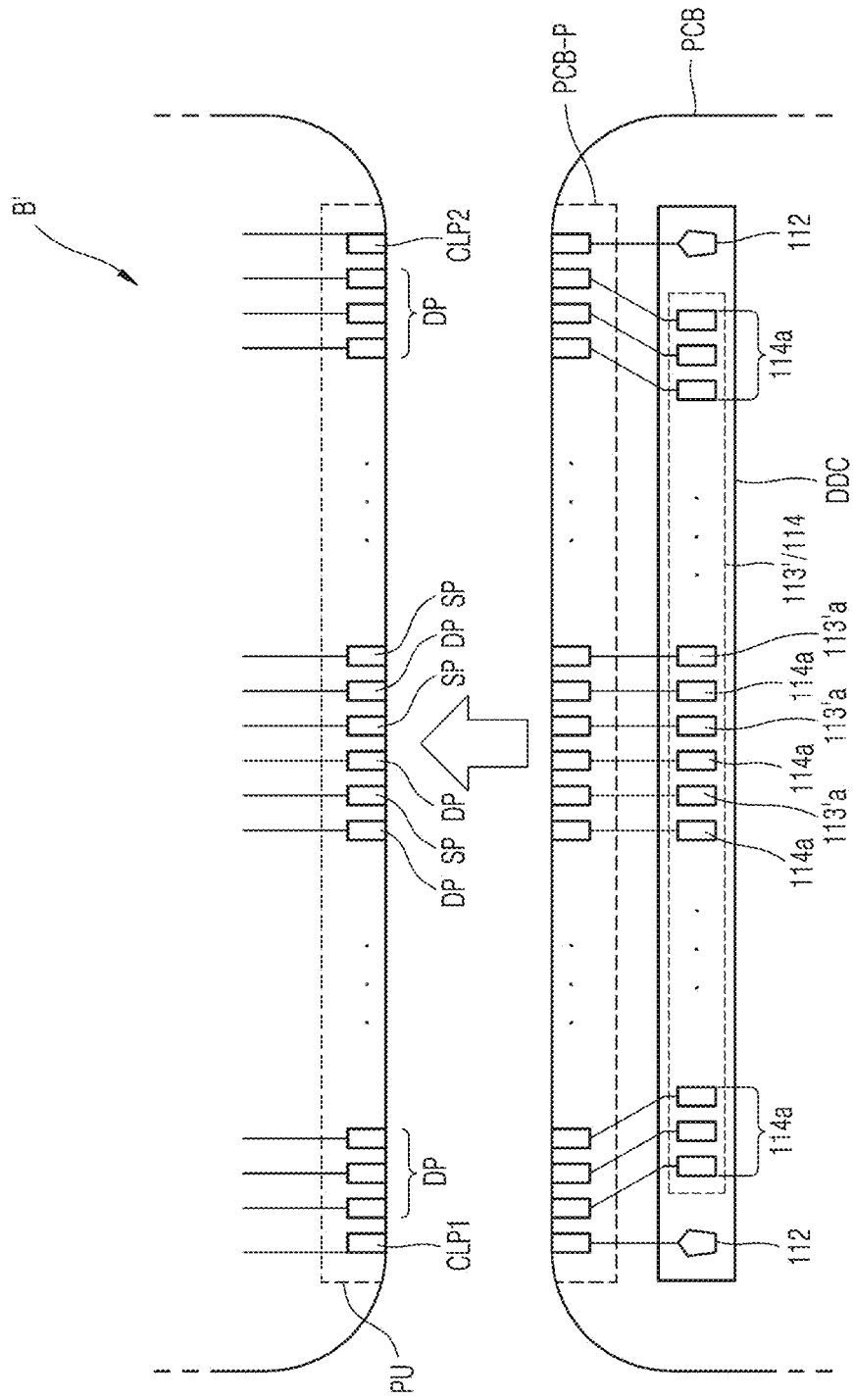
FIG. 9 is a schematic enlarged plan view of a portion B' of FIG. 7.

FIG. 8 is a schematic block diagram of a display driving circuit DDC according to an embodiment, and FIG. 9 is a schematic enlarged plan view of a portion B' of FIG. 7.

Referring to FIG. 8, the display driving circuit DDC includes a timing controller 111, a clock signal output circuit 112, a gate driving circuit 113', a data driving circuit 114, and an electrode portion 120. The electrode portion 120 includes a first clock electrode 121, a second clock electrode 125, a plurality of scan electrodes 122', and a plurality of data electrodes 123 connected to the first clock pad CLP1 respectively, the second clock pad CLP2, the scan pads SP, and the data pads DP described above with reference to FIG. 7.

The timing controller 111 may generate various control signals that control the driving timing of the display panel 10. The timing controller 111 may control a scan signal output of the gate driving circuit 113'. Also, the timing controller 111 may transmit image data to the data driving circuit 114. The data driving circuit 114 may receive image data from the timing controller 111, generate a data voltage corresponding to the image data, and transmit the data voltage to the display panel 10.

The timing controller 111 may include a clock signal output circuit 112 that outputs a first clock signal to the first clock electrode 121 and outputs a second clock signal to the second clock electrode 125. Although FIG. 8 illustrates that the timing controller 111 includes the clock signal output circuit 112, the clock signal output circuit 112 may be separately implemented to output the first and second clock signals to the first and second clock electrodes 121 and 125, respectively, under the control of the timing controller 111.

The gate driving circuit 113' is configured to sequentially output a scan signal to the scan electrodes 122' in synchronization with a clock signal.

The data driving circuit 114 is configured to output data voltages to the data electrodes 123 in synchronization with the clock signal.

Referring to FIG. 9, the display driving circuit DDC is mounted on a printed circuit board PCB, and the printed circuit board PCB is mounted on the pad portion PU of the display panel 10. A terminal PCB-P of the printed circuit board PCB may be electrically connected to the pad portion PU of the display panel 10.

The printed circuit board PCB includes wirings configured to connect the first clock electrode 121, the second clock electrode 125, the scan electrodes 122', and the data electrodes 123 to the first clock pad CLP1, the second clock pad CLP2, the scan pads SP, and the data pads DP.

The gate driving circuit 113' included in the display driving circuit DDC includes a plurality of scan signal output circuits 113'*a*. The scan signal output circuits 113'*a* are configured to output scan signals to the scan electrodes 122'.

The data driving circuit 114 included in the display driving circuit DDC includes a plurality of data voltage output circuits 114*a*. The data voltage output circuits 114*a* are configured to output data voltages to the data electrodes 123.

The scan signal output circuits 113'*a* may be between the data voltage output circuits 114*a*. Although FIG. 9 illustrates that the scan signal output circuits 113'*a* and the data voltage output circuits 114*a* are alternately arranged with each other, two or more data voltage output circuits 114*a* may be between the scan signal output circuits 113'*a*. As another example, as illustrated in FIG. 6, the scan signal output circuits 113*a* may be arranged on the left or right side of the pad portion PU and may be connected to the first scan lines SL1, respectively, via the connection lines CL.

The display driving circuit DDC may be implemented as a single semiconductor integrated circuit chip. In this case, the display driving circuit DDC may be referred to as a display driving apparatus.

The display driving apparatus may be implemented as a single semiconductor integrated circuit chip that drives the display panel 10 having m scan lines SL and n data lines DL and may include a first clock electrode 121, a second clock electrode 125, a plurality of scan electrodes 122', a plurality of data electrodes 123, a clock signal output circuit 112, a gate driving circuit 113', and a data driving circuit 114.

The clock signal output circuit 112 outputs, to the first and second clock electrodes 121 and 125, a clock signal used to generate a local scan signal for sequentially driving some of the m scan lines SL in the display panel 10.

In an embodiment, the number of scan electrodes 122' may be less than m. m is an integer.

The first scan lines SL1 among the scan lines SL arranged on the display panel 10 according to the embodiment may be directly connected to the scan pads SP, respectively, or may be connected to the scan pads SP via the connection lines CL, respectively. In this case, only a space for arranging various pads is required at the lower end of the display panel 10. Therefore, the peripheral area PA of the display panel 10 may be reduced.

Although the display driving apparatus, the display panel, and the display apparatus have been described, the disclosure according to the invention is not limited thereto. In another embodiment, for example, methods of manufacturing the display driving apparatus, methods of manufacturing the display panel, and method of manufacturing the display apparatus will also fall within the scope of the disclosure.

According to one or more embodiments, the display driving apparatus, the display panel, and the display apparatus, in which the peripheral area is reduced, may be implemented. The scope of the disclosure according to the invention is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display panel comprising:
   a substrate comprising a display area and a peripheral area surrounding the display area;
   a plurality of pixels arranged in the display area;
   a pad portion arranged in the peripheral area and comprising a first clock pad, a plurality of first scan pads, and a plurality of data pads;
   a first scan driving circuit arranged in the peripheral area and comprising a plurality of first stages;
   a plurality of scan lines extending in a first direction and comprising a plurality of first scan lines and a plurality of second scan lines, wherein the plurality of first scan lines are electrically and directly connected to the plurality of first scan pads, respectively, the plurality of second scan lines are connected to the plurality of first stages, respectively, and each of the plurality of scan lines is connected to pixels located in a same row among the plurality of pixels; and
   a plurality of data lines extending in a second direction intersecting with the first direction and connected to corresponding data pads, respectively, among the plurality of data pads, wherein each of the plurality of data lines is connected to pixels located in a same column among the plurality of pixels, wherein the plurality of scan lines is configured to sequentially transmit a current scan signal to the plurality of pixels by a pixel-row unit, and the plurality of first stages is connected to the first clock pad and configured to receive a first clock signal from the first clock pad and sequentially outputs the current scan signal to the plurality of second scan lines based on the first clock signal.

2. The display panel of claim 1, wherein a number of pixels connected to one of the plurality of first scan lines is less than a number of pixels connected to one of the plurality of second scan lines.

3. The display panel of claim 1, wherein a length of a portion of each of the plurality of first scan lines extended in the first direction is less than a length of a portion of each of the plurality of second scan lines extended in the first direction.

4. The display panel of claim 1, wherein each of the plurality of first stages is connected to a previous first stage or a previous scan line and configured to receive a previous control signal from the previous first stage or a previous scan signal from the previous scan line and generate the current scan signal based on the first clock signal and one of the previous control signal and the previous scan signal.

5. The display panel of claim 1, wherein a first-order first stage among the plurality of first stages is connected to a last-order first scan line among the plurality of first scan lines and configured to receive a previous scan signal from the last-order first scan line and generates the current scan signal based on the first clock signal and the previous scan signal.

6. The display panel of claim 1, wherein the pad portion further comprises a plurality of second scan pads, and
each of the plurality of first scan lines comprises:
a first end connected to a corresponding first scan pad among the plurality of first scan pads; and
a second end connected to a corresponding second scan pad among the plurality of second scan pads,
wherein the first end and the second end are disposed symmetrically with respect to a center of the pad portion.

7. The display panel of claim 6, wherein the pad portion further comprises a second clock pad,
the display panel further comprises a second scan driving circuit arranged in the peripheral area and comprising a plurality of second stages connected to the plurality of second scan lines, respectively,
the plurality of first stages is connected to the first clock pad and configured to receive a first clock signal from the first clock pad and sequentially outputs a first scan signal to the plurality of second scan lines based on the first clock signal,
the plurality of second stages is connected to the second clock pad and configured to receive a second clock signal from the second clock pad and sequentially outputs a second scan signal to the plurality of second scan lines based on the second clock signal,
the first clock signal and the second clock signal are synchronized with each other, and
the first scan signal and the second scan signal are synchronized with each other.

8. The display panel of claim 7, wherein the plurality of data pads is disposed between the plurality of first scan pads and the plurality of second scan pads, and the plurality of data lines is disposed between the first scan driving circuit and the second scan driving circuit.

9. The display panel of claim 1, wherein the plurality of scan lines further comprises a plurality of third scan lines located in the second direction from the plurality of first scan lines and the plurality of second scan lines and extending in the first direction, and
the display area comprises:
a first display area in which pixels connected to the plurality of first scan lines among the plurality of pixels are arranged;
a second display area in which pixels connected to the plurality of second scan lines among the plurality of pixels are arranged; and
a third display area in which pixels connected to the plurality of third scan lines among the plurality of pixels are arranged.

10. The display panel of claim 9, wherein number of pixels connected to a first scan line of the plurality of first scan lines gradually decrease in a direction away from the second display area,
number of pixels connected to each of the plurality of second scan lines is constant, and
number of pixels connected to a third scan line of the plurality of third scan lines gradually decreases in a direction away from the second display area.

11. The display panel of claim 9, wherein the first scan driving circuit further comprises a plurality of third stages connected to the plurality of third scan lines, respectively,
the plurality of first stages is arranged in a line in the second direction, and
the plurality of third stages is arranged to shift in the first direction along the second direction.

12. The display panel of claim 11, wherein the plurality of third stages is connected to the first clock pad and configured to receive a first clock signal from the first clock pad, and
each of the plurality of third stages is connected to a previous stage and configured to receive a previous control signal from the previous stage, and generates a scan signal based on the first clock signal and the previous control signal, and
the plurality of third stages sequentially outputs the scan signal to the plurality of third scan lines.

13. A display panel comprising:
a substrate comprising a display area and a peripheral area surrounding the display area;
a plurality of pixels arranged in the display area;
a pad portion arranged in the peripheral area and comprising a first clock pad, a plurality of first scan pads, and a plurality of data pads;
a first scan driving circuit arranged in the peripheral area and comprising a plurality of first stages;
a plurality of scan lines extending in a first direction and comprising a plurality of first scan lines and a plurality of second scan lines, wherein the plurality of first scan lines are connected to the plurality of first scan pads, respectively, the plurality of second scan lines are connected to the plurality of first stages, respectively, and each of the plurality of scan lines is connected to pixels located in a same row among the plurality of pixels;
a plurality of data lines extending in a second direction intersecting with the first direction and connected to corresponding data pads, respectively, among the plurality of data pads and pixels, wherein each of the plurality of data lines is connected to pixels located in a same column among the plurality of pixels; and a plurality of connection lines connecting the plurality of first scan pads to the plurality of first scan lines, respectively, wherein each of the plurality of connection lines has a portion extending in the second direction between the plurality of data lines.

14. The display panel of claim 13, wherein the plurality of first scan pads is disposed between the plurality of data pads.

15. A display apparatus comprising:

a plurality of pixels;

a pad portion comprising a first clock pad, a plurality of first scan pads, and a plurality of data pads;

a first scan driving circuit comprising a plurality of first stages;

a plurality of scan lines extending in a first direction and comprising a plurality of first scan lines and a plurality of second scan lines, wherein the plurality of first scan lines are electrically and directly connected to the plurality of first scan pads, respectively, the plurality of second scan lines are connected to the plurality of first stages, respectively, and each of the plurality of scan lines is connected to pixels located in a same row among the plurality of pixels;

a plurality of data lines extending in a second direction intersecting with the first direction and connected to corresponding data pads, respectively, among the plurality of data pads, wherein each of the plurality of data lines is connected to pixels located in a same column among the plurality of pixels; and a display driving circuit which drives the plurality of pixels, wherein number of pixels connected to one of the plurality of first scan lines is less than number of pixels connected to one of the plurality of second scan lines.

16. The display apparatus of claim 15, wherein the display driving circuit further comprises:

an electrode portion comprising a clock electrode, a plurality of scan electrodes, and a plurality of data electrodes connected to the first clock pad, the plurality of first scan pads, and the plurality of data pads, respectively;

a clock signal output circuit which outputs a clock signal to the clock electrode;

a gate driving circuit which sequentially outputs a scan signal to the plurality of scan electrodes in synchronization with the clock signal; and a data driving circuit which outputs data voltages to the plurality of data electrodes in synchronization with the clock signal.

17. The display apparatus of claim 16, further comprising a printed circuit board comprising wirings which connect the clock electrode, the plurality of scan electrodes, and the plurality of data electrodes to the first clock pad, the plurality of first scan pads, and the plurality of data pads, respectively, wherein the display driving circuit is mounted on the printed circuit board, and the printed circuit board is mounted on the pad portion.

18. A display driving apparatus implemented as a single semiconductor integrated circuit chip which drives a display panel having m scan lines and n data lines, wherein m and n are natural numbers, the display driving apparatus comprising:

a clock electrode;

a plurality of scan electrodes;

a plurality of data electrodes;

a clock signal output circuit which outputs, to the clock electrode, a clock signal used to generate a local scan signal for sequentially driving some of the m scan lines in the display panel;

a gate driving circuit which sequentially outputs an external scan signal to the plurality of scan electrodes in synchronization with the clock signal; and a data driving circuit which outputs a plurality of data voltages to the plurality of data electrodes in synchronization with the clock signal, wherein number of the plurality of scan electrodes is less than m, wherein the plurality of scan electrodes are configured to be connected to fewer than m scan lines.

19. A display driving apparatus implemented as a single semiconductor integrated circuit chip which drives a display panel having a plurality of scan lines, a clock pad, a plurality of scan pads electrically directly connected to some of the plurality of scan lines, respectively, and a panel gate driving circuit to sequentially output a local scan signal to others of the plurality of scan lines in synchronization with a clock signal received via the clock pad, the display driving apparatus comprising:

a clock electrode to be electrically directly connected to the clock pad to provide the clock signal to the panel gate driving circuit in the display panel;

a plurality of scan electrodes to be electrically and directly connected to the plurality of scan pads, respectively, to sequentially output an external scan signal to the some of the plurality of scan lines;

a clock signal output circuit which outputs the clock signal to the clock electrode; and a gate driving circuit which sequentially outputs the external scan signal to the plurality of scan electrodes in synchronization with the clock signal; and wherein number of the plurality of scan electrodes is less than number of the plurality of scan lines.

20. The display driving apparatus of claim 19, wherein the display panel has a plurality of data lines, a plurality of data pads directly connected to the plurality of data lines, respectively, and the display driving apparatus further comprises:

a plurality of data electrodes to be electrically directly connected to the plurality of data pads, respectively; and a data driving circuit which outputs a plurality of data voltages to the plurality of data electrodes in synchronization with the clock signal.

* * * * *